(12) United States Patent
Ueda

(10) Patent No.: US 8,773,890 B2
(45) Date of Patent: Jul. 8, 2014

(54) SEMICONDUCTOR MEMORY DEVICE

(71) Applicant: Kabushiki Kaisha Toshiba, Tokyo (JP)

(72) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/963,955

(22) Filed: Aug. 9, 2013

(65) Prior Publication Data

US 2013/0322163 A1   Dec. 5, 2013

Related U.S. Application Data

(63) Continuation of application No. 13/053,041, filed on Mar. 21, 2011, now Pat. No. 8,508,977.

(30) Foreign Application Priority Data

Mar. 23, 2010   (JP) ................................. 2010-066951

(51) Int. Cl.
   *G11C 11/00* (2006.01)
(52) U.S. Cl.
   USPC .................... 365/148; 365/210.1; 365/230.03
(58) Field of Classification Search
   CPC . G11C 5/063; G11C 13/0002; G11C 2213/10
   USPC .................................. 365/148, 210.1, 230.03
   See application file for complete search history.

(56) References Cited

U.S. PATENT DOCUMENTS 6,091,633 A * 7/2000 Cernea et al. ............ 365/185.13
6,809,976 B2 10/2004 Ooishi
7,233,537 B2 6/2007 Tanizaki et al.
7,385,866 B2 6/2008 Lin et al.
2004/0047216 A1 3/2004 Ishikawa et al.
2009/0316471 A1 12/2009 Tsuchida
2010/0046274 A1 2/2010 Tsuchida
2010/0054020 A1 3/2010 Ueda

FOREIGN PATENT DOCUMENTS

| JP | 2003-297072 | 10/2003 |
| JP | 2004-103060 | 4/2004 |
| JP | 2010-003391 | 1/2010 |
| JP | 2010-061743 | 3/2010 |

OTHER PUBLICATIONS

Japanese Office Action dated Jun. 5, 2012 for Japanese Application No. 2010-066951 filed on Mar. 23, 2010.
Toshiba, Background Art Information, Jul. 14, 2010 and Sep. 3, 2010.

* cited by examiner

*Primary Examiner* — Don Dinh
*Assistant Examiner* — Nam Nguyen
(74) *Attorney, Agent, or Firm* — Knobbe, Martens, Olson & Bear, LLP

(57) ABSTRACT

According to one embodiment, a semiconductor memory device includes a first cell array includes memory cells and reference cells, a second cell array located adjacent to the first cell array in a first direction, a third cell array located adjacent to the first cell array in a second direction crossing the first direction, a fourth cell array located adjacent to the second cell array in the second direction, and a sense amplifier connected to the first to fourth cell array and configured to compare a current through a memory cell with a current through a reference cell to determine the data of the memory cell. A reference cell is selected from a cell array which is diagonally opposite to a cell array as a read target.

17 Claims, 12 Drawing Sheets

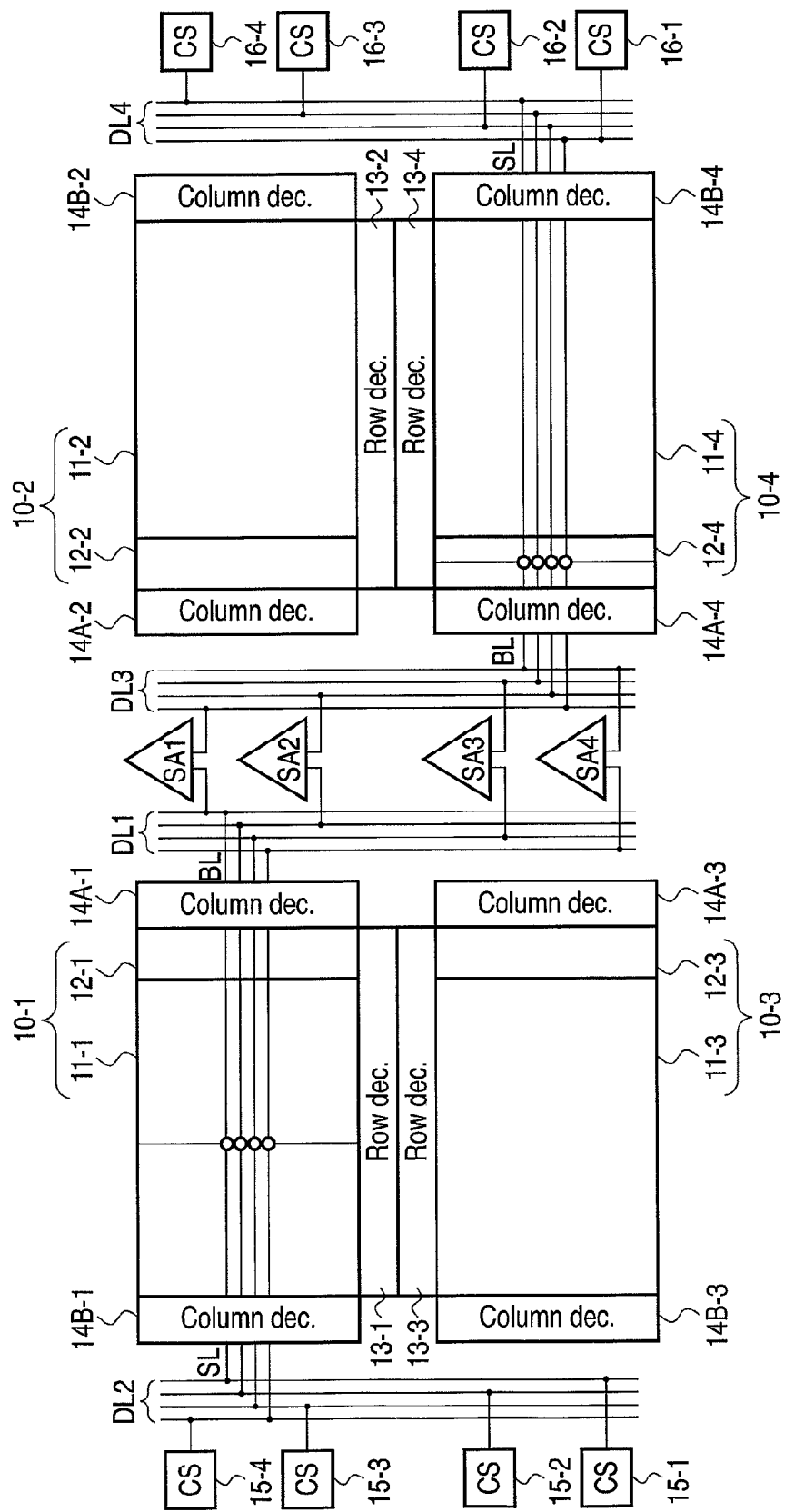
F I G. 7

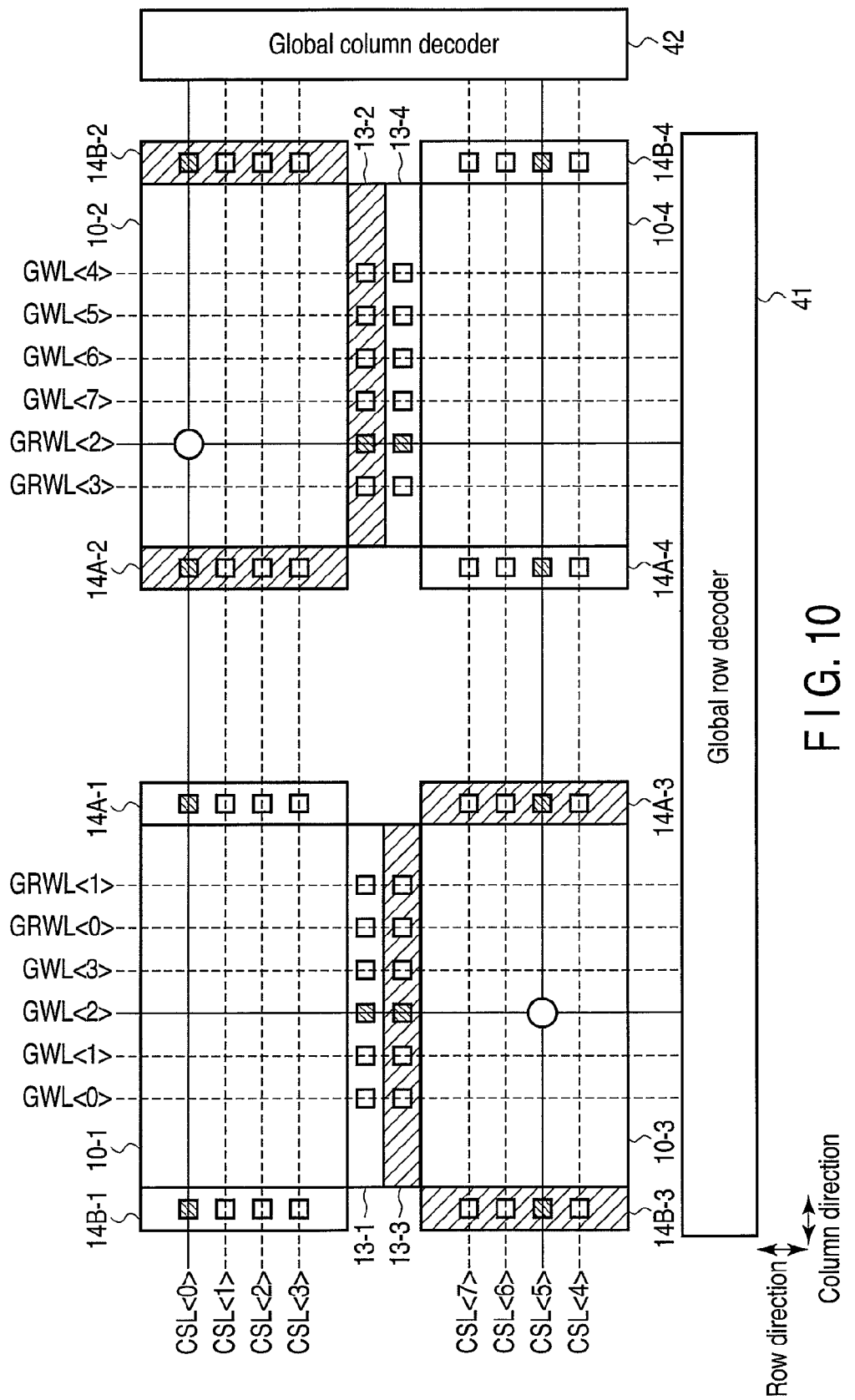
F I G. 10

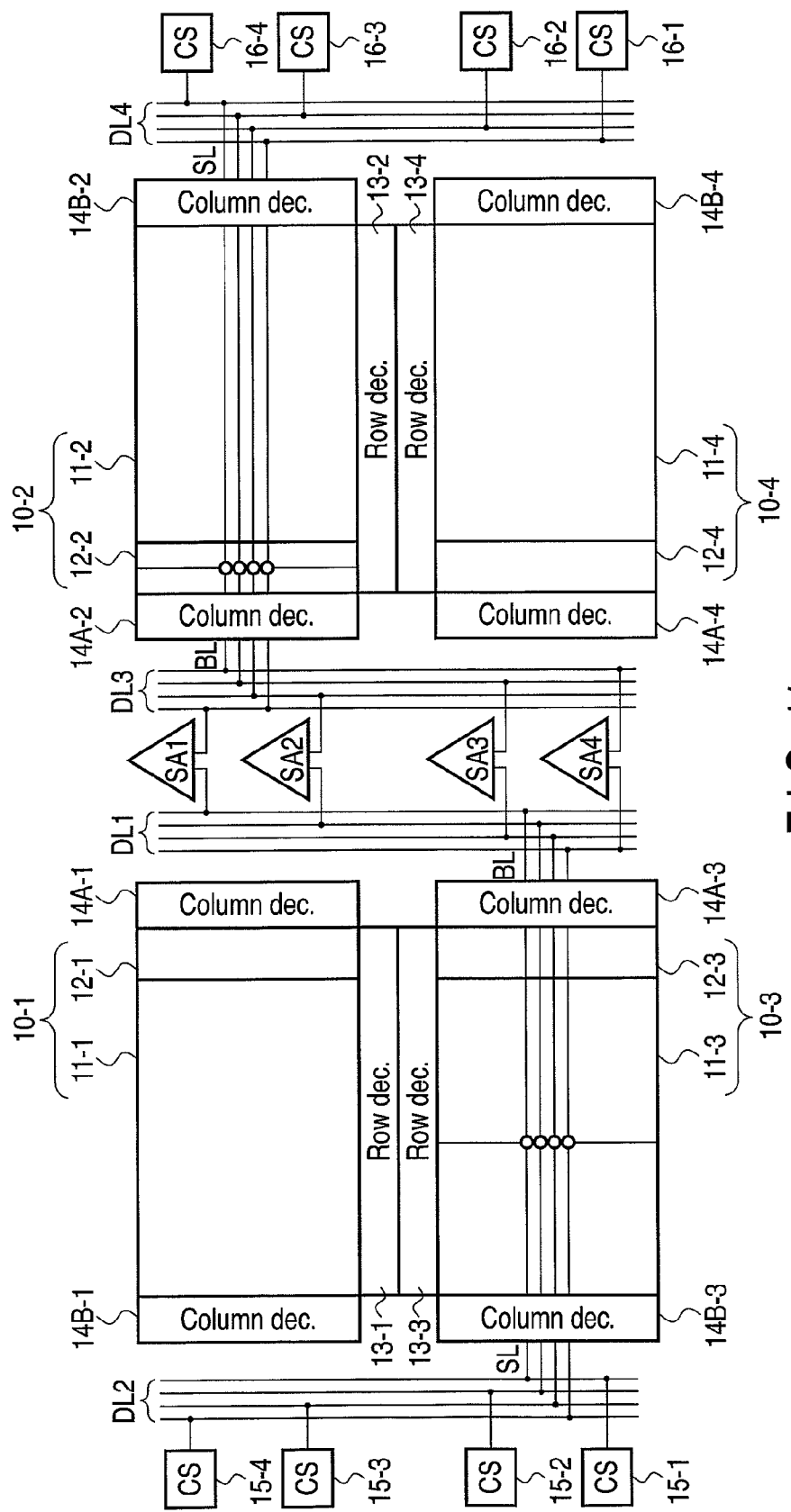
F I G. 11

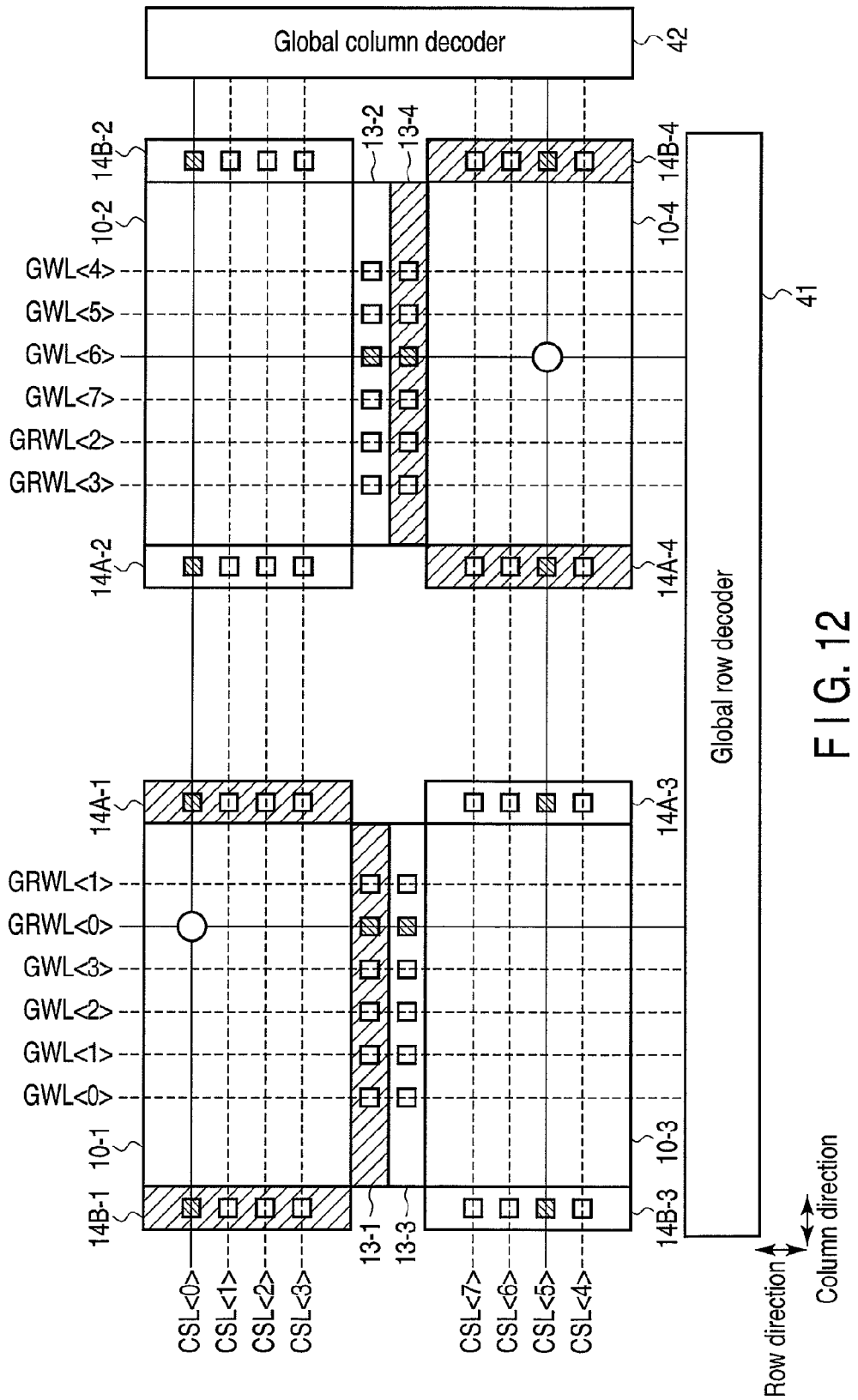
F I G. 12

SEMICONDUCTOR MEMORY DEVICE

CROSS-REFERENCE TO RELATED APPLICATIONS

This application is a continuation of U.S. patent application Ser. No. 13/053,041, filed Mar. 21, 2011, which is based upon and claims the benefit of priority from Japanese Patent Application No. 2010-066951, filed Mar. 23, 2010; the entire contents of these applications are incorporated herein by reference.

FIELD

Embodiments described herein relate generally to a semiconductor memory device.

BACKGROUND

Semiconductor memory devices (resistance-change memories) configured to store data utilizing changes in the resistance of each memory element include a magnetic random access memory (MRAM), a resistive random access memory (ReRAM), and a phase-change random access memory (PCRAM).

The resistance-change memory is characterized in that a plurality of resistance states of a variable-resistance element are associated with data. For example, a low-resistance state of the variable-resistance element is defined to be binary 0. A high-resistance state of the variable-resistance element is defined to be binary 1.

Data is read from an MRAM by using a sense amplifier to compare a read current flowing through a memory cell with a reference current flowing through a reference cell. At this time, a read voltage is applied to the memory cell, and a reference voltage is applied to the reference cell. This method is disclosed in Jpn. Pat. Appln. KOKAI Publication No. 2003-297072.

BRIEF DESCRIPTION OF THE DRAWINGS

FIG. 7 is a schematic diagram illustrating the operation of a row decoder 13 and a column decoder 14;

FIG. 10 is a schematic diagram illustrating the operation of the global row decoder 41 and the global column decoder 42 according to a third embodiment;

FIG. 11 is a schematic diagram illustrating the operation of the row decoder 13 and the column decoder 14;

FIG. 12 is a schematic diagram illustrating the operation of the global row decoder 41 and the global column decoder 42 according to a fourth embodiment.

DETAILED DESCRIPTION

Figure 1:
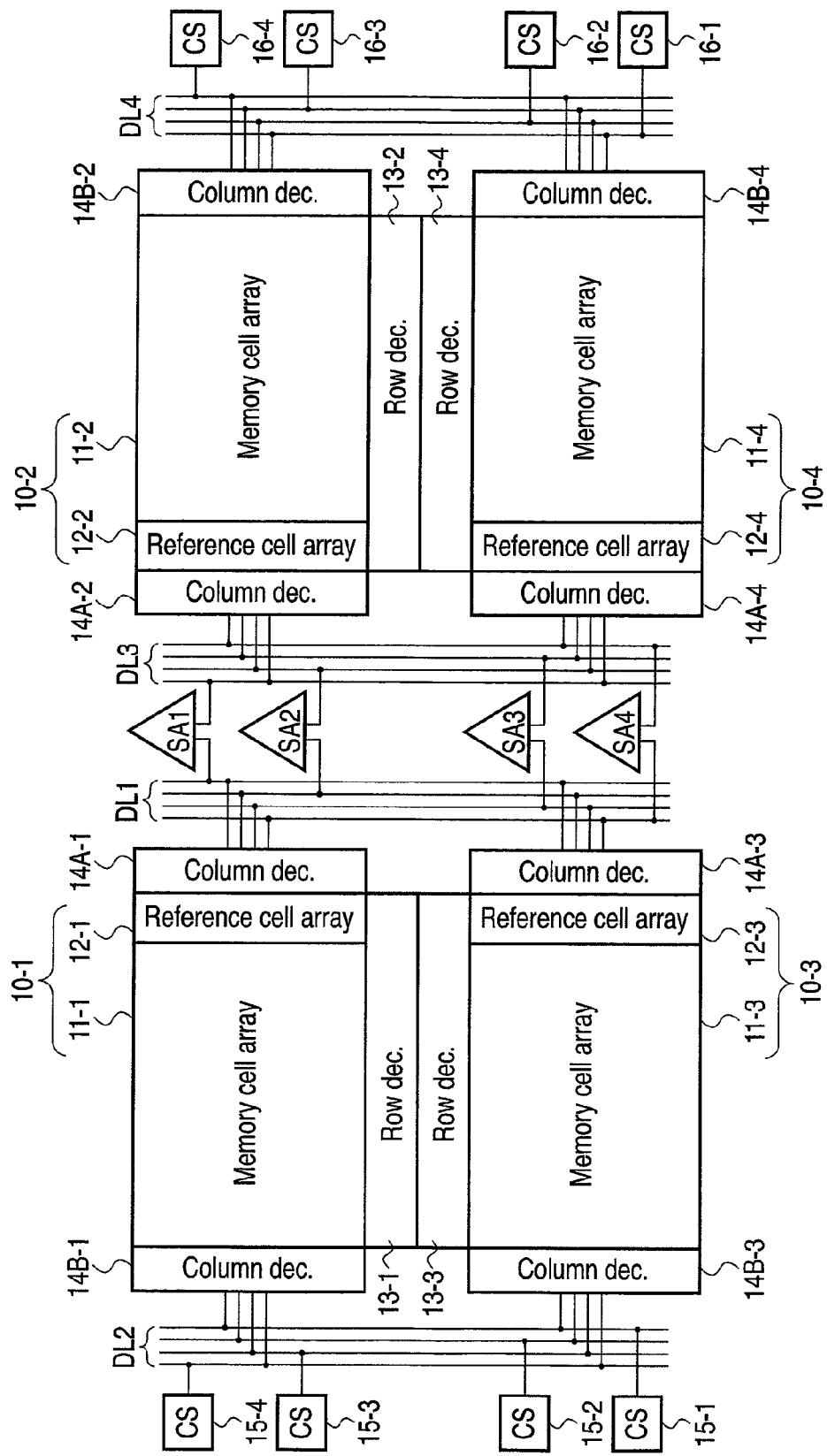
FIG. 1 is a block diagram showing the configuration of an MRAM according to an embodiment.

In general, according to one embodiment, there is provided a semiconductor memory device comprising:

a first cell array comprising memory cells and reference cells, each of the memory cells comprising a variable resistance element configured to store data on the basis of a change in resistance, each of the reference cells comprising a resistance used to determine data of the memory cell;

a second cell array located adjacent to the first cell array in a first direction;

a third cell array located adjacent to the first cell array in a second direction crossing the first direction;

a fourth cell array located adjacent to the second cell array in the second direction; and a sense amplifier connected to the first to fourth cell array and configured to compare a current through a memory cell with a current through a reference cell to determine the data of the memory cell, wherein a reference cell is selected from a cell array which is diagonally opposite to a cell array as a read target.

The embodiments will be described hereinafter with reference to the accompanying drawings. In the description which follows, the same or functionally equivalent elements are denoted by the same reference numerals, to thereby simplify the description.

Any of various types of memories such as an MRAM, ReRAM, and PCRAM can be used as a resistance-change memory according to the present embodiment. In the description of the present embodiment, an MRAM is taken as an example. An MRAM comprises magnetic tunnel junction (MTJ) elements that utilize the magnetoresistive effect, as memory elements. The MRAM stores data based on the magnetization configuration of the MTJ elements.

FIG. 1 is a block diagram showing the configuration of an MRAM according to an embodiment. The MRAM comprises four cell arrays 10-1 to 10-4, four sense amplifiers SA1 to SA4, and eight current sinks (CS) 15-1 to 15-4 and 16-1 to 16-4, as shown in FIG. 1. The cell arrays 10-1 to 10-4 comprise memory cell arrays 11-1 to 11-4 and reference cell arrays 12-1 to 12-4.

A row decoder 13-1 is connected to the underside of the upper left cell array 10-1. A column decoder (Column dec.) 14A-1 is connected to both a sense amplifier and the cell array 10-1. A column decoder 14B-1 is connected to both a current sink and the cell array 10-1. A row decoder 13-2 is connected to the underside of the upper right cell array 10-2. A column decoder 14A-2 is connected to both a sense amplifier and the cell array 10-2. A column decoder 14B-2 is connected to both a current sink and the cell array 10-2. A row decoder 13-3 is connected to the upside of the lower left cell array 10-3. A column decoder 14A-3 is connected to both a sense amplifier and the cell array 10-3. A column decoder 14B-3 is connected to both a current sink and the cell array 10-3. A row decoder 13-4 is connected to the upside of the lower right cell array 10-4. A column decoder 14A-4 is connected to both a sense amplifier and the cell array 10-4. A column decoder 14B-4 is connected to both a current sink and the cell array 10-4.

Figure 2:
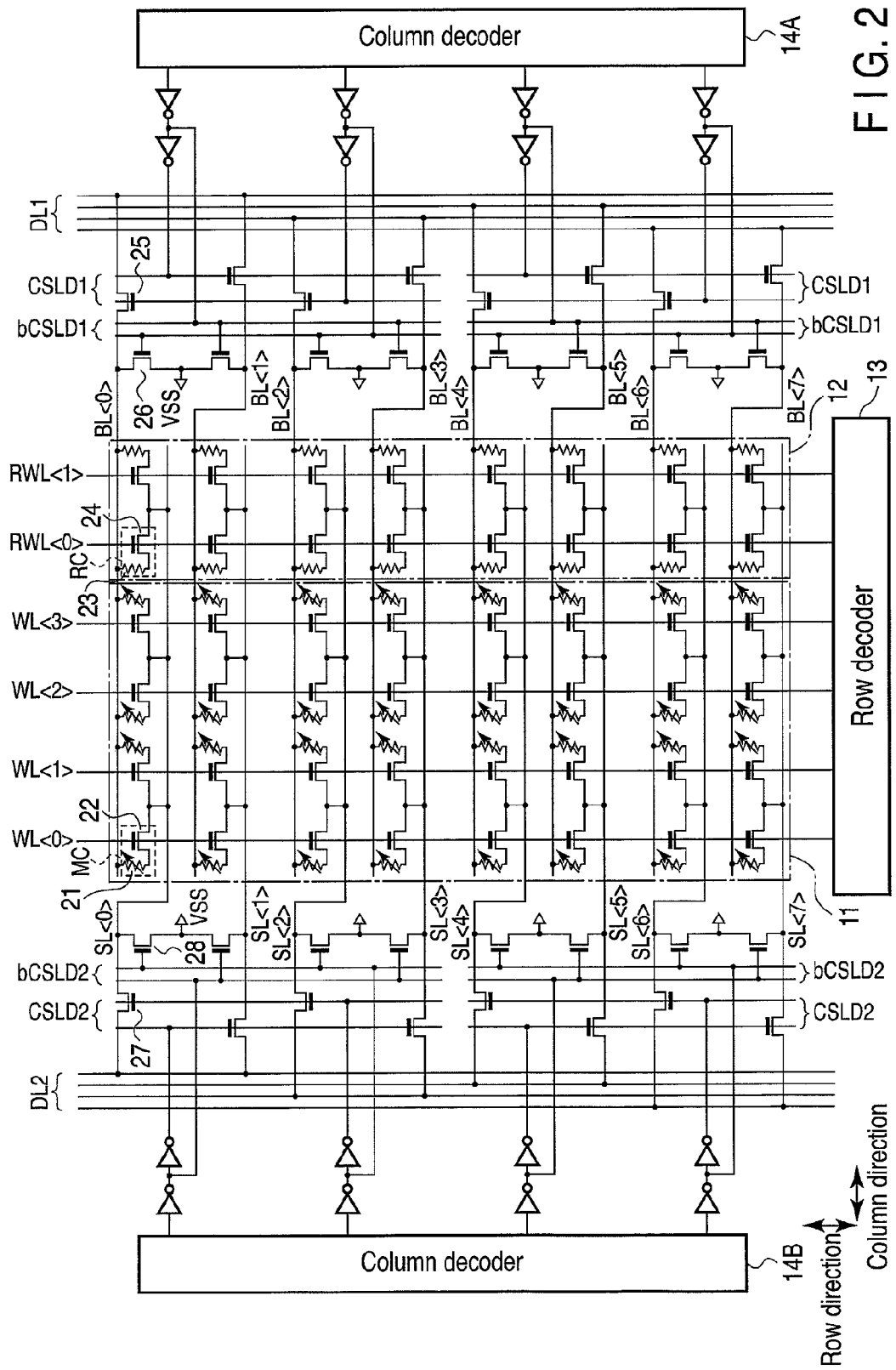
FIG. 2 is a circuit diagram showing the configuration of one cell array 10 and peripheral circuits around the cell array 10.

FIG. 2 is a circuit diagram showing the configuration of one cell array 10 and its peripheral circuits. Each of the cell arrays 10-1 to 10-4 is configured as shown in FIG. 2. The cell array 10 includes a plurality of bit lines BL, a plurality of source lines SL, a plurality of word lines WL, and a plurality of reference word lines RWL; the bit lines BL extend in a column direction, the source lines SL extend in the column direction, the word lines WL extend in a row direction, and the reference word lines RWL extend in the row direction. FIG. 2 illustrates eight bit lines BL<0> to BL<7>, eight source lines SL<0> to SL<7>, four word lines WL<0> to WL<3>, and two reference word lines RWL<0> and RWL<1>. However, the numbers of these lines are not particularly limited. In actuality, the cell array comprises more lines than shown in FIG. 2.

As described above, the cell array 10 comprises the memory cell array 11 and the reference cell array 12. The memory cell array 11 comprises a plurality of memory cells MC arranged in a matrix. The reference cell array 12 comprises a plurality of reference cells RC arranged in a matrix.

The memory cell MC comprises a variable resistance element 21 and a select transistor 22. For example, an n-channel metal oxide semiconductor field-effect transistor (MOSFET) is used as the select transistor 22. One end of the variable resistance element 21 is connected to a bit line BL<m>. The other end of the variable resistance element 21 is connected to one end of a current path in the select transistor 22. The other end of the current path in the select transistor 22 is connected to a source line SL<m>. A gate of the select transistor 22 is connected to a word line WL<n>. Here, m denotes any integer between 0 and 7, and n denotes any integer between 0 and 3.

Figure 3:
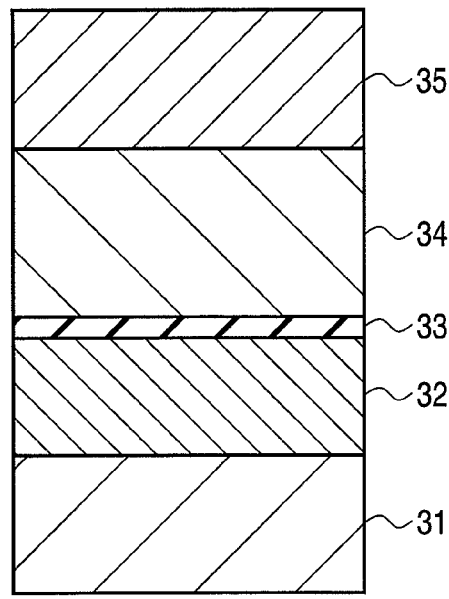
FIG. 3 is a sectional view showing the configuration of an MTJ element 21.

A magnetoresistive element (MTJ element) is used as the variable resistance element 21. FIG. 3 is a sectional view showing the configuration of the MTJ element 21. The MTJ element 21 comprises a lower electrode 31, a recording layer (also referred to as a storage layer or a free layer) 32, a nonmagnetic layer 33, a reference layer (also referred to as a pinned layer) 34, and an upper electrode 35 stacked in order. This stacking order may be reversed. Each of the recording layer 32 and the reference layer 34 comprises a ferromagnetic layer.

Each of the recording layer 32 and the reference layer 34 has magnetization anisotropy in a direction perpendicular to a film surface. Each of the recording layer 32 and the reference layer 34 has a magnetization easy direction perpendicular to the film surface. The magnetization direction of the recording layer 32 and the reference layer 34 may be parallel to the film surface.

The recording layer 32 has a variable (reversible) magnetization (or spinning) direction. The reference layer 34 has an invariable (pinned) magnetization direction. The reference layer 34 is designed to have sufficiently higher vertical magnetic anisotropic energy than the recording layer 32. The magnetic anisotropy can be designed, for example, by adjusting material constitution and film thickness. In this manner, a magnetization reversal current through the recording layer 32 is reduced so that a magnetization reversal current through the reference layer 34 is larger than that through the recording layer 32. Thus, the MTJ element 21 can be implemented which comprises the recording layer 32 with a variable magnetization direction and the reference layer 34 with an invariable magnetization direction, with respect to a write current.

Figure 4:
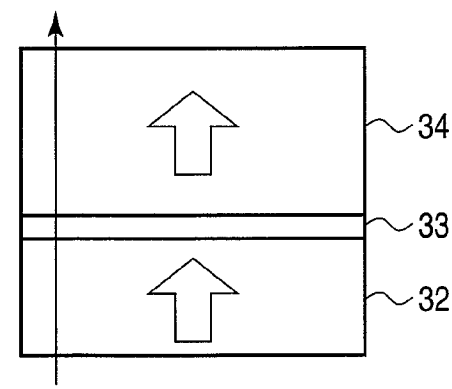
FIG. 4 is a schematic diagram illustrating the magnetization state of the MTJ element 21.
Figure 4:
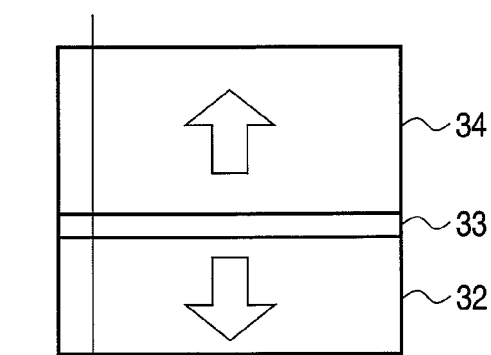

FIG. 4 is a schematic diagram illustrating the magnetization state of the MTJ element 21. The present embodiment adopts a spin injection write scheme in which a write current is allowed to flow directly through the MTJ element so that the write current controls the magnetization state of the MTJ element 21. The MTJ element 21 can assume one of two states, a high-resistance state and a low-resistance state depending on whether the relative magnetization relationship between the recording layer 32 and the reference layer 34 is parallel or antiparallel.

As shown in FIG. 4(a), when a write current flowing from the recording layer 32 to the reference layer 34 is allowed to flow through the MTJ element 21, the relative magnetization relationship between the recording layer 32 and the reference layer 34 is parallel. In this parallel state, the MTJ element 21 has the least resistance. That is, the MTJ element 21 is set to the low-resistance state. The low-resistance state of the MTJ element 21 is specified, for example, as binary 0.

As shown in FIG. 4(b), when a write current flowing from the reference layer 34 to the recording layer 32 is allowed to flow through the MTJ element 21, the relative magnetization relationship between the recording layer 32 and the reference layer 34 is antiparallel. In this antiparallel state, the MTJ element 21 has the greatest resistance. That is, the MTJ element 21 is set to the high-resistance state. The high-resistance state of the MTJ element 21 is specified, for example, as binary 1. Then, the MTJ element 21 can be used as a storage element in which a one-bit (binary) value can be stored.

As shown in FIG. 2, the reference cell RC comprises a resistance element 23 and a select transistor 24. The resistance element 23 is used to produce a reference current serving as a reference for determination of the data in the memory cell MC. The resistance of the resistance element 23 is fixed. The resistance element 23 has, for example, a stack structure similar to that of the MTJ element. The magnetization in the recording layer 32 is pinned as with the reference layer 34. One end of the resistance element 23 is connected to the bit line BL<m>. The other end of the resistance element 23 is connected to one end of a current path in the select transistor 24. The other end of the current path in the select transistor 24 is connected to a source line SL<m>. A gate of the select transistor 24 is connected to a reference word line RWL<l>. l denotes either one of the integers 0 and 1.

Each of the bit lines BL is connected to one of four data lines DL1 (or DL3) via a column select transistor 25. For example, an n-channel MOSFET is used as the column select transistor 25. A gate of the column select transistor 25 is connected to a select line CSLD1.

A column decoder 14A is connected to the column select lines CSLD1 via buffers each which comprises two inverters connected in series. The column decoder 14A controllably turns on and off the column select transistors 25 via the column select lines CSLD1 so that four bit lines BL are connected to the respective data lines DL1 during one read operation.

A clamp transistor 26 is connected to each bit line BL. For example, an n-channel MOSFET is used as the clamp transistor 26. A drain of the clamp transistor 26 is connected to the bit line BL. A gate of the clamp transistor 26 is connected to a control line bCSLD1. A source of the clamp transistor 26 is grounded (connected to a power source VSS). An inversion signal for the column select line CSLD1 is supplied to the control line bCSLD1. The clamp transistor 26 sets an unselected bit line BL to the ground potential VSS. Thus, bit lines adjacent to a selected bit line BL are always set to the ground voltage VSS, allowing a stable read operation to be implemented.

Each of the source lines SL is connected to one of four data lines DL2 (or DL4) via a column select transistor 27. A gate of the column select transistor 27 is connected to a column select line CSLD2.

A column decoder 14B is connected to the column select lines CSLD2 via buffers each which comprises two inverters connected in series. The column decoder 14B turns on and off the column select transistors 27 via the column select lines CSLD2 so that four source lines SL are connected to the respective data lines DL2 during one read operation.

A clamp transistor 28 is connected to each source line SL. A drain of the clamp transistor 28 is connected to the source line SL. A gate of the clamp transistor 28 is connected to a control line bCSLD2. A source of the clamp transistor 28 is grounded. An inversion signal for the column select line CSLD2 is supplied to the control line bCSLD2. The clamp transistor 28 sets an unselected source line SL to the ground potential VSS. Thus, source lines adjacent to a selected source line SL are always set to the ground voltage VSS, allowing a stable read operation to be implemented.

As shown in FIG. 1, the four data lines DL1 are connected to first input terminals of four sense amplifiers SA1 to SA4, respectively. The four data lines DL3 are connected to second input terminals of the four sense amplifiers SA1 to SA4, respectively. Each of the sense amplifiers SA1 to SA4 compares a reference current applied to one input terminal with a read current applied to the other input terminal to determine the data in the selected memory cell to be read.

The four data lines DL2 are connected to four current sinks 15-1 to 15-4, respectively. The current sinks 15-1 to 15-4 draw (sink) currents flowing through the source lines SL disposed in the cell arrays 10-1 and 10-3. Similarly, the four data lines DL4 are connected to four current sinks 16-1 to 16-4, respectively. The current sinks 16-1 to 16-4 draw currents flowing through the source lines SL disposed in the cell arrays 10-2 and 10-4.

Figure 5:
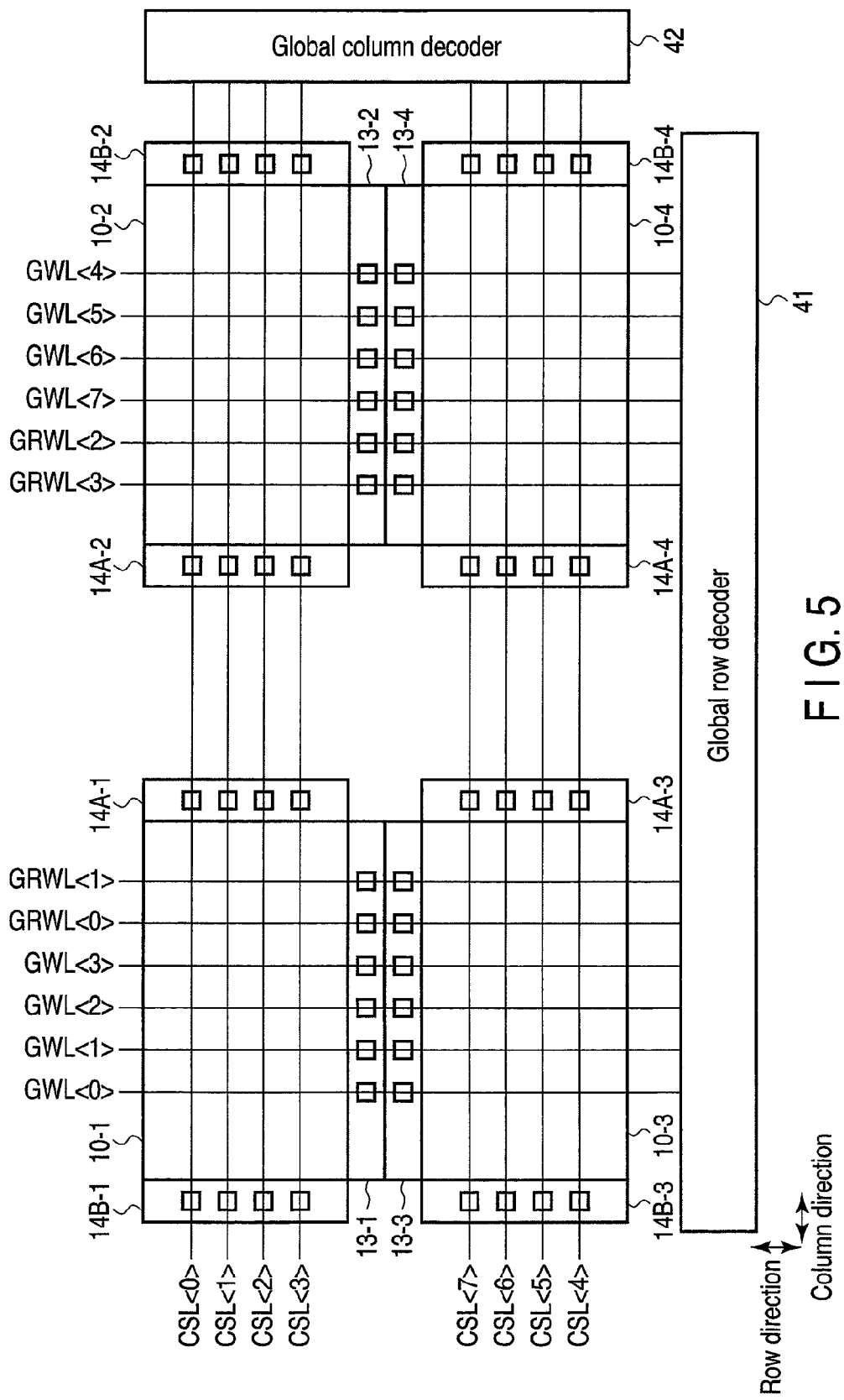
FIG. 5 is a block diagram showing the configuration of a global row decoder 41 and a global column decoder 42.

Now, a global row decoder 41 and a global column decoder 42 will be described; the global row decoder 41 controls the row decoders 13-1 to 13-4, and the global column decoder 42 controls the column decoders 14A-1 to 14A-4 and 14B-1 to 14B-4. In the present embodiment, the four cell arrays 10-1 to 10-4 need to be independently controlled. Thus, the MRAM comprises the global row decoder 41 configured to integrally control the four row decoders 13-1 to 13-4 and the global row decoder 42 configured to integrally control the eight column decoders 14A-1 to 14A-4 and 14B-1 to 14B-4. FIG. 5 is a block diagram showing the configuration of the global row decoder 41 and the global column decoder 42.

The MRAM comprises global word lines GWL<0> to GWL<7> extending in the row direction, global reference word lines GRWL<0> to GRWL<3> extending in the row direction, and column select lines CSL<0> to CSL<7> extending in the column direction. The numbers of the lines are illustrative and vary depending on the size of the cell array 10.

The global row decoder 41 is connected to the global word lines GWL<0> to GWL<7> and the global reference word lines GRWL<0> to GRWL<3>. To read data, the global row decoder 41 simultaneously activates one of the global word lines GWL and one of the global reference word lines GRWL.

The global column decoder 42 is connected to the column select lines CSL<0> to CSL<7>. To read data, the global column decoder 42 simultaneously activates one of the column select lines CWL<0> to CWL<3> and one of the column select lines CSL<4> to CSL<7>.

The global word lines GWL<0> to GWL<3> and the global reference word lines GRWL<0> and GRWL<1> are connected to the row decoders 13-1 and 13-3. Each of the row decoders 13-1 and 13-3 activates a the word lines WL or reference word line RWL on the basis of the activated global word line GWL or global reference word line GRWL.

The global word lines GWL<4> to GWL<7> and the global reference word lines GRWL<2> and GRWL<3> are connected to the row decoders 13-2 and 13-4. Each of the row decoders 13-2 and 13-4 activates a word line WL or reference word line RWL on the basis of the activated global word line GWL or global reference word line GRWL.

The column select lines CSL<0> to CSL<3> are connected to the column decoders 14A-1, 14B-1, 14A-2, and 14B-2. The column decoders 14A-1 and 14A-2 activate the bit line BL corresponding to the activated column select line CSL. The column decoders 14B-1 and 14B-2 activate the source line SL corresponding to the activated column select line CSL.

The column select lines CSL<4> to CSL<7> are connected to the column decoders 14A-3, 14B-3, 14A-4, and 14B-4. The column decoders 14A-3 and 14A-4 activate the bit line BL corresponding to the activated column select line CSL. The column decoders 14B-3 and 14B-4 activate the source line SL corresponding to the activated column select line CSL.

Operation

Now, the operation of the MRAM configured as described above will be described. In the present embodiment, four types (a first embodiment to a fourth embodiment) of read operations are possible in reading data. The read operations according to the first to fourth embodiments will be described below in order. In the present embodiment, data is simultaneously read from four memory cells MC in one memory cell array 11 during one read operation. The number of memory cells MC simultaneously selected for one read operation is not particularly limited but may be one or at least two.

First Embodiment

Figure 6:
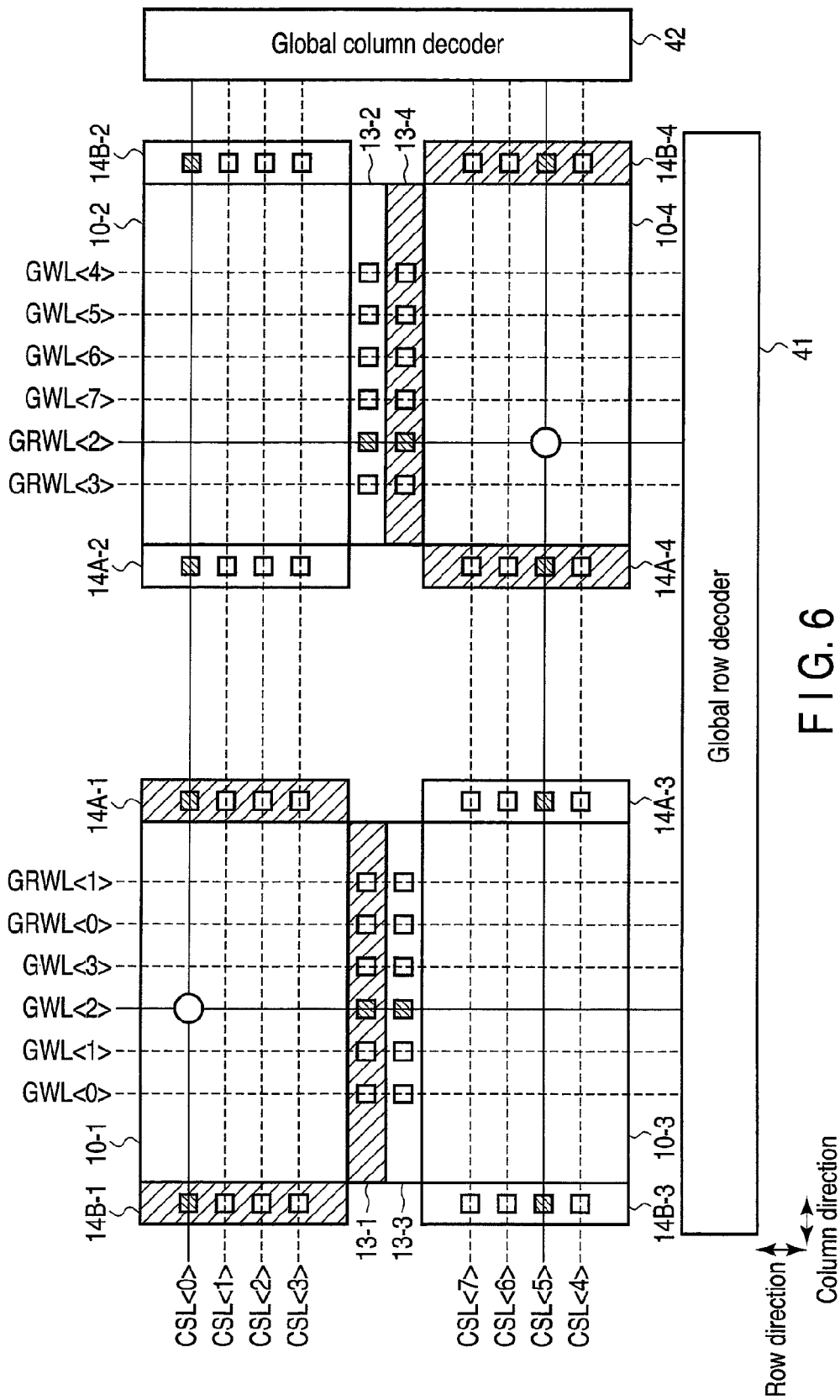
FIG. 6 is a schematic diagram illustrating the operation of the global row decoder 41 and the global column decoder 42 according to a first embodiment.

The first embodiment is an operation of reading data from the memory cell array 11-1. FIG. 6 is a schematic diagram illustrating the operation of the global row decoder 41 and the global column decoder 42 according to the first embodiment.

The global row decoder 41 activates any one of the global word lines GWL<0> to GWL<3> (in FIG. 6, for example, GWL<2>). The global column decoder 42 activates any one of the column select lines CSL<0> to CSL<3> (in FIG. 6, for example, CSL<0>). Then, as shown in FIG. 6, a circular area in the cell array 10-1 is selected.

Furthermore, the global row decoder 41 activates either one of the global reference word lines GRWL<2> and GRWL<3> (in FIG. 6, for example, GRWL<2>). The global column decoder 42 activates any one of the column select lines CSL<4> to CSL<7> (in FIG. 6, for example, CSL<5>). Then, as shown in FIG. 6, a circular area in the cell array 10-4 is selected.

At this time, the selected cell arrays 10-1 and 10-4 and the row decoders and column decoders connected to the cell arrays 10-1 and 10-4 are activated by a block activation signal (not shown in the drawings). Furthermore, the unselected cell arrays 10-2 and 10-3 and the row decoders and column decoders connected to the cell arrays 10-2 and 10-3 are inactivated by the block activation signal.

FIG. 7 is a schematic diagram illustrating the operation of the row decoder 13 and the column decoder 14. The row decoder 13-1 activates one word line WL in response to the activated global word line GWL<2>. The column decoder 14A-1 connects four bit lines BL to the four data lines DL1 in response to the activated column select line CSL<0>. The column decoder 14B-1 connects four source lines SL to the four data lines DL2 in response to the activated column select line CSL<0>. At this time, a read current flows from the sense amplifier SA through the memory cell MC to the current sink 15.

Furthermore, the row decoder 13-4 activates one reference word line RWL in response to the activated global reference word line GRWL<2>. The column decoder 14A-4 connects four bit lines BL to the four data lines DL3 in response to the activated column select line CSL<5>. The column decoder 14B-4 connects four source lines SL to the four data lines DL4 in response to the activated column select line CSL<5>. At this time, a reference current flows from the sense amplifier SA through the reference cell RC to the current sink 16.

Each of the sense amplifiers SA1 to SA4 compares the reference current with the read current to determine the data in the selected memory cell. Thus, the data is read from the memory cell array 11-1.

Second Embodiment

Figure 8:
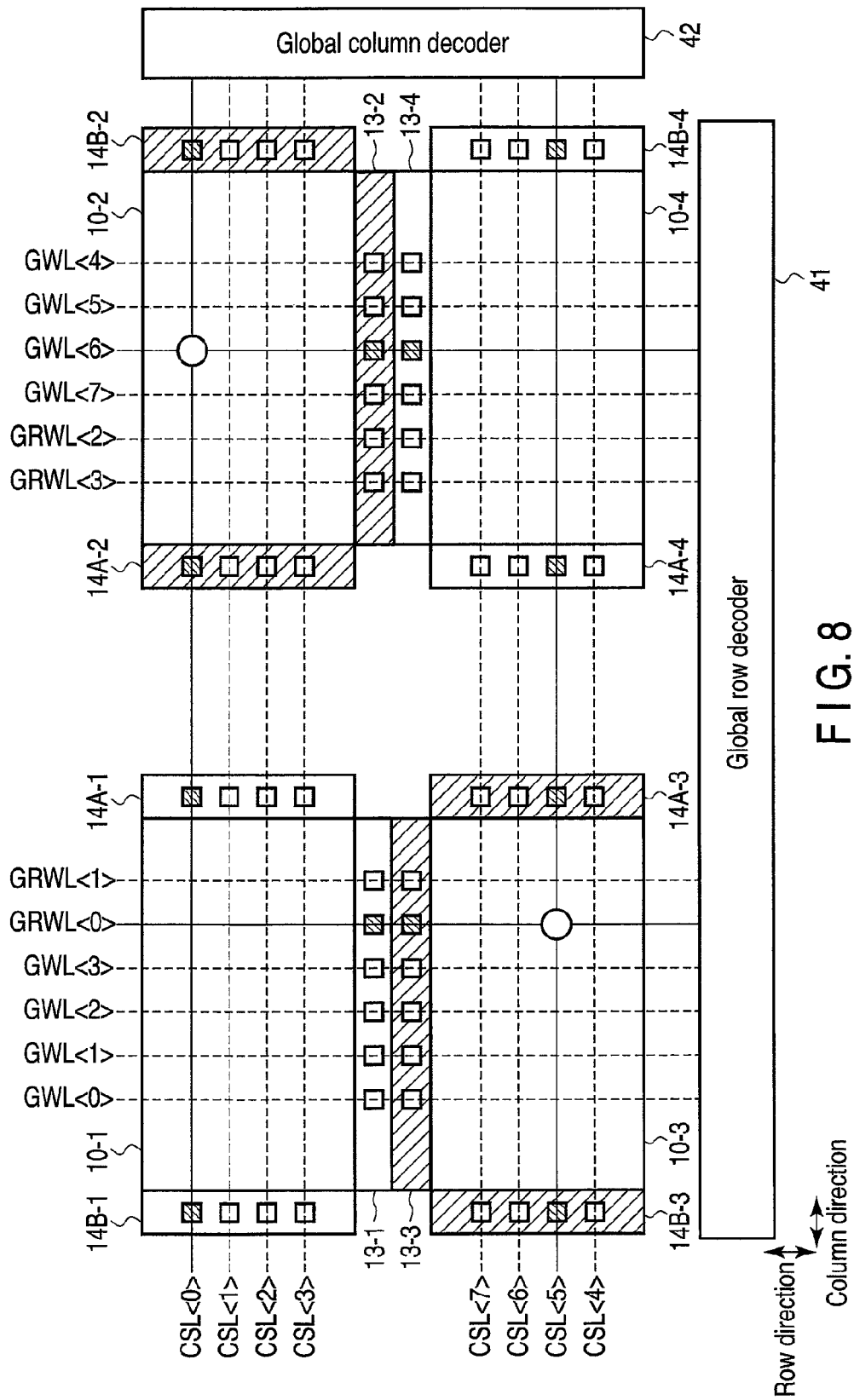
FIG. 8 is a schematic diagram illustrating the operation of the global row decoder 41 and the global column decoder 42 according to a second embodiment.

The second embodiment is an operation of reading data from the memory cell array 11-2. FIG. 8 is a schematic diagram illustrating the operation of the global row decoder 41 and the global column decoder 42 according to the second embodiment.

The global row decoder 41 activates any one of the global word lines GWL<4> to GWL<7> (in FIG. 8, for example, GWL<6>). The global column decoder 42 activates any one of the column select lines CSL<0> to CSL<3> (in FIG. 8, for example, CSL<0>). Then, as shown in FIG. 8, a circular area in the cell array 10-2 is selected.

Furthermore, the global row decoder 41 activates either one of the global reference word lines GRWL<0> and GRWL<1> (in FIG. 8, for example, GRWL<0>). The global column decoder 42 activates any one of the column select lines CSL<4> to CSL<7> (in FIG. 8, for example, CSL<5>). Then, as shown in FIG. 8, a circular area in the cell array 10-3 is selected.

At this time, the selected cell arrays 10-2 and 10-3 and the row decoders and column decoders connected to the cell arrays 10-2 and 10-3 are activated by a block activation signal (not shown in the drawings). Furthermore, the unselected cell arrays 10-1 and 10-4 and the row decoders and column decoders connected to the cell arrays 10-1 and 10-4 are inactivated by the block activation signal.

Figure 9:
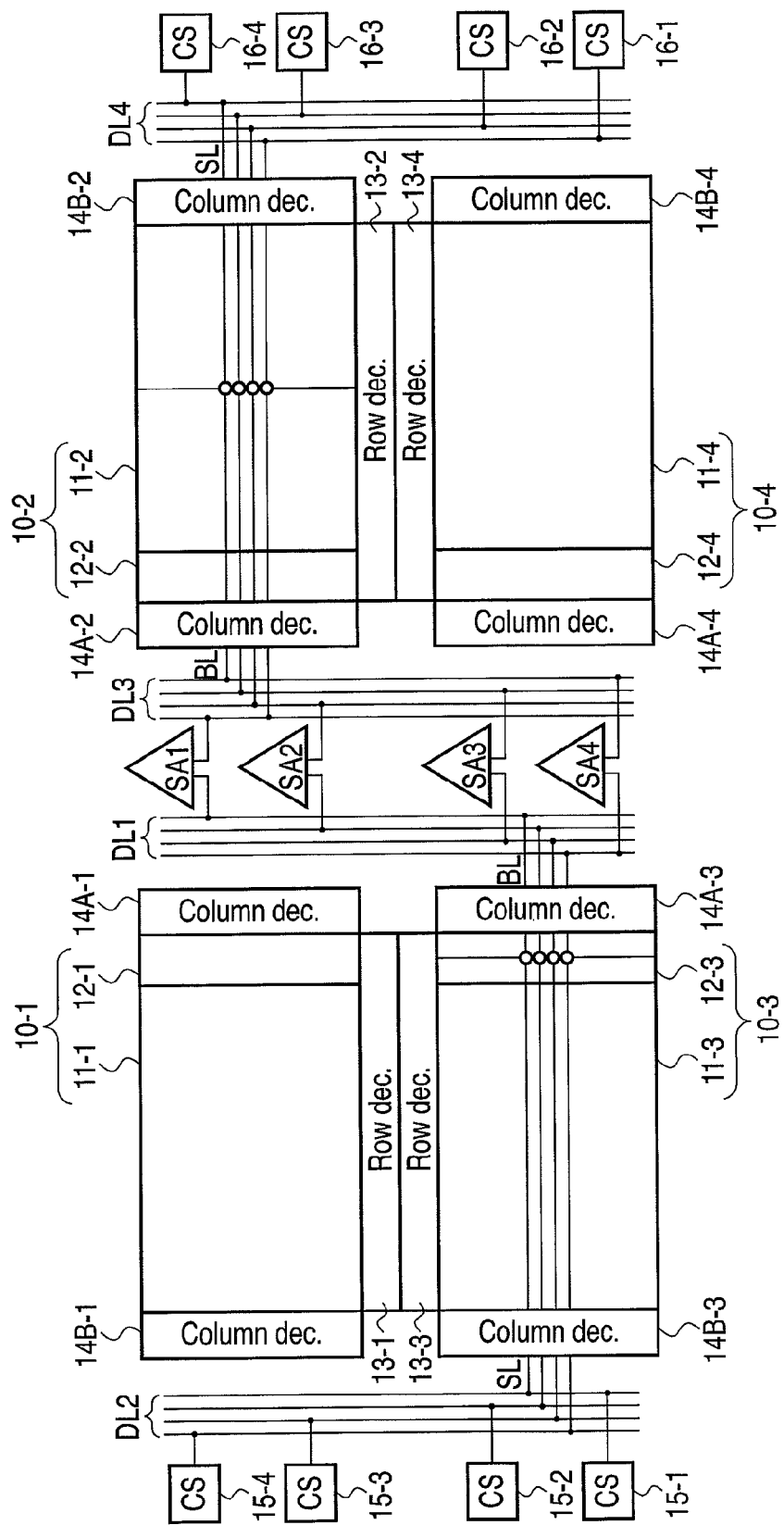
FIG. 9 is a schematic diagram illustrating the operation of the row decoder 13 and the column decoder 14.

FIG. 9 is a schematic diagram illustrating the operation of the row decoder 13 and the column decoder 14. The row decoder 13-2 activates one word line WL in response to the activated global word line GWL<6>. The column decoder 14A-2 connects four bit lines BL to the four data lines DL3 in response to the activated column select line CSL<0>. The column decoder 14B-2 connects four source lines SL to the four data lines DL4 in response to the activated column select line CSL<0>. At this time, a read current flows from the sense amplifier SA through the memory cell MC to the current sink 16.

Furthermore, the row decoder 13-3 activates one reference word line RWL in response to the activated global reference word line GRWL<0>. The column decoder 14A-3 connects four bit lines BL to the four data lines DL1 in response to the activated column select line CSL<5>. The column decoder 14B-3 connects four source lines SL to the four data lines DL2 in response to the activated column select line CSL<5>. At this time, a reference current flows from the sense amplifier SA through the reference cell RC to the current sink 15.

Each of the sense amplifiers SA1 to SA4 compares the reference current with the read current to determine the data in the selected memory cell. Thus, the data is read from the memory cell array 11-2.

Third Embodiment

The third embodiment is an operation of reading data from the memory cell array 11-3. FIG. 10 is a schematic diagram illustrating the operation of the global row decoder 41 and the global column decoder 42 according to the third embodiment.

The global row decoder 41 activates any one of the global word lines GWL<0> to GWL<3> (in FIG. 10, for example, GWL<2>). The global column decoder 42 activates any one of the column select lines CSL<4> to CSL<7> (in FIG. 10, for example, CSL<5>). Then, as shown in FIG. 10, a circular area in the cell array 10-3 is selected.

Furthermore, the global row decoder 41 activates either one of the global reference word lines GRWL<2> and GRWL<3> (in FIG. 10, for example, GRWL<2>). The global column decoder 42 activates any one of the column select lines CSL<0> to CSL<3> (in FIG. 10, for example, CSL<0>). Then, as shown in FIG. 10, a circular area in the cell array 10-2 is selected.

At this time, the selected cell arrays 10-2 and 10-3 and the row decoders and column decoders connected to the cell arrays 10-2 and 10-3 are activated by a block activation signal (not shown in the drawings). Furthermore, the unselected cell arrays 10-1 and 10-4 and the row decoders and column decoders connected to the cell arrays 10-1 and 10-4 are inactivated by the block activation signal.

FIG. 11 is a schematic diagram illustrating the operation of the row decoder 13 and the column decoder 14. The row decoder 13-3 activates one word line WL in response to the activated global word line GWL<2>. The column decoder 14A-3 connects four bit lines BL to the four data lines DL1 in response to the activated column select line CSL<5>. The column decoder 14B-3 connects four source lines SL to the four data lines DL2 in response to the activated column select line CSL<5>. At this time, a read current flows from the sense amplifier SA through the memory cell MC to the current sink 15.

Furthermore, the row decoder 13-2 activates one reference word line RWL in response to the activated global reference word line GRWL<2>. The column decoder 14A-2 connects four bit lines BL to the four data lines DL3 in response to the activated column select line CSL<0>. The column decoder 14B-2 connects four source lines SL to the four data lines DL4 in response to the activated column select line CSL<0>. At this time, a reference current flows from the sense amplifier SA through the reference cell RC to the current sink 16.

Each of the sense amplifiers SA1 to SA4 compares the reference current with the read current to determine the data in the selected memory cell. Thus, the data is read from the memory cell array 11-3.

Fourth Embodiment

The fourth embodiment is an operation of reading data from the memory cell array 11-4. FIG. 12 is a schematic diagram illustrating the operation of the global row decoder 41 and the global column decoder 42 according to the fourth embodiment.

The global row decoder 41 activates any one of the global word lines GWL<4> to GWL<7> (in FIG. 12, for example, GWL<6>). The global column decoder 42 activates any one of the column select lines CSL<4> to CSL<7> (in FIG. 12, for example, CSL<5>). Then, as shown in FIG. 12, a circular area in the cell array 10-4 is selected.

Furthermore, the global row decoder 41 activates either one of the global reference word lines GRWL<0> and GRWL<1> (in FIG. 12, for example, GRWL<0>). The global column decoder 42 activates any one of the column select lines CSL<0> to CSL<3> (in FIG. 12, for example, CSL<0>). Then, as shown in FIG. 12, a circular area in the cell array 10-1 is selected.

At this time, the selected cell arrays 10-1 and 10-4 and the row decoders and column decoders connected to the cell arrays 10-1 and 10-4 are activated by a block activation signal (not shown in the drawings). Furthermore, the unselected cell arrays 10-2 and 10-3 and the row decoders and column decoders connected to the cell arrays 10-2 and 10-3 are inactivated by the block activation signal.

Figure 13:
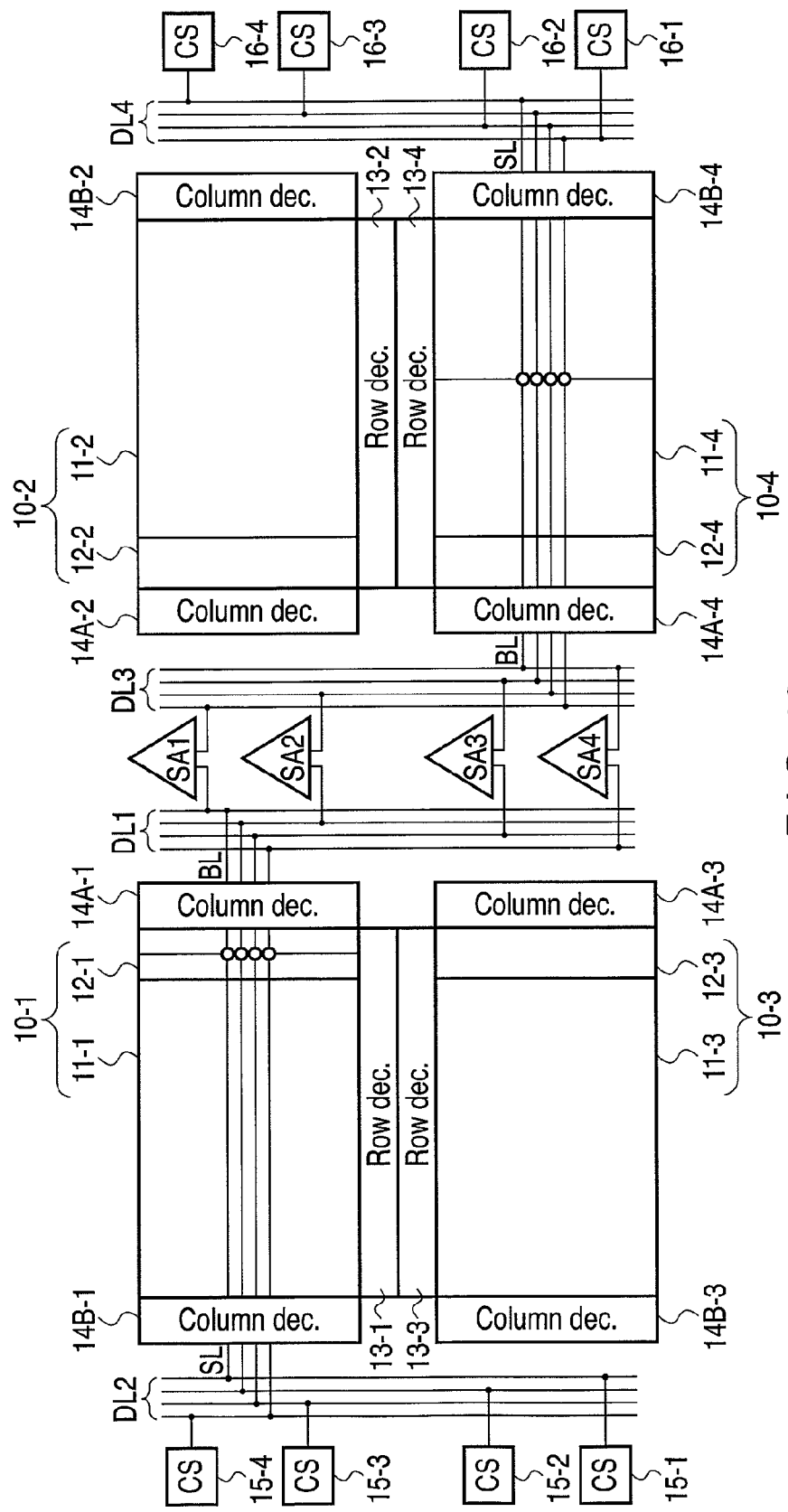
FIG. 13 is a schematic diagram illustrating the operation of the row decoder 13 and the column decoder 14.

FIG. 13 is a schematic diagram illustrating the operation of the row decoder 13 and the column decoder 14. The row decoder 13-4 activates one word line WL in response to the activated global word line GWL<6>. The column decoder 14A-4 connects four bit lines BL to the four data lines DL1 in response to the activated column select line CSL<5>. The column decoder 14B-4 connects four source lines SL to the four data lines DL2 in response to the activated column select line CSL<5>. At this time, a read current flows from the sense amplifier SA through the memory cell MC to the current sink 16.

Furthermore, the row decoder 13-1 activates one reference word line RWL in response to the activated global reference word line GRWL<0>. The column decoder 14A-1 connects four bit lines BL to the four data lines DL3 in response to the activated column select line CSL<0>. The column decoder 14B-1 connects four source lines SL to the four data lines DL4 in response to the activated column select line CSL<0>. At this time, a reference current flows from the sense amplifier SA through the reference cell RC to the current sink 15.

Each of the sense amplifiers SA1 to SA4 compares the reference current with the read current to determine the data in the selected memory cell. Thus, the data is read from the memory cell array 11-4.

Advantages

As described above in detail, in the present embodiment, the semiconductor memory device (MRAM) comprises the four cell arrays 10-1 to 10-4 arranged in a matrix along the row direction and the column direction. The row decoder 13 and the column decoder 14 are connected to each of the cell arrays 10 in order to select the memory cell MC and the reference cell RC. Moreover, the MRAM comprises the global row decoder 41 configured to control the row decoder 13 via the global word line GWL and the global reference word line GRWL, and the global column decoder 42 configured to control the column decoder 14 via the column select line CSL.

Thus, the present embodiment allows independent control of the global word line GWL and column select line used to select the memory cell MC and the global reference word line GRWL and column select line CSL used to select the reference cell RC. Thus, when reading data, the selected memory cell MC and the selected reference cell RC can be selected from the different cell arrays 10. This enables an increase not only in the degree of freedom of selection from the memory cells MC but also in the degree of freedom of selection from the reference cells RC. As a result, if the reference cells vary in resistance, the reference cell with the optimum resistance can be selected, allowing the read margin to be improved. Furthermore, misreads can be reduced, allowing the reliability of data to be improved.

In the description of the present embodiment, an MRAM has been taken as an example of a resistance-change memory. However, the present embodiment is applicable to various types of memories such as other resistance-change memories, for example, an ReRAM and PCRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first cell array comprising first memory cells and first reference cells, each of the first memory cells comprising a variable resistance element;
   a second cell array located adjacent to the first cell array in a first direction, the second cell array comprising second memory cells and second reference cells, each of the second memory cells comprising a variable resistance element;
   a third cell array located adjacent to the first cell array in a second direction crossing the first direction, the third cell array comprising third memory cells and third reference cells, each of the third memory cells comprising a variable resistance element;
   a fourth cell array located adjacent to the third cell array in the first direction, the fourth cell array comprising fourth memory cells and fourth reference cells, each of the fourth memory cells comprising a variable resistance element;
   a first word line electrically connected to a part of the first memory cells and the second memory cells;
   a second word line electrically connected to the other part of the first memory cells and the second memory cells;
   a first reference word line electrically connected to the first reference cells and the second reference cells;
   a third word line electrically connected to a part of the third memory cells and the fourth memory cells;
   a fourth word line electrically connected to the other part of the third memory cells and the fourth memory cells;
   a second reference word line electrically connected to the third reference cells and the fourth reference cells;
   a first select line electrically connected to a part of the first memory cells and the third memory cells;
   a second select line electrically connected to the other part of the first memory cells and the third memory cells;
   a third select line electrically connected to a part of the second memory cells and the fourth memory cells; and
   a fourth select line electrically connected to the other part of the second memory cells and the fourth memory cells,
   wherein the first word line, the second reference word line, the first select line, and the third select line are simultaneously selected.

2. The device of claim 1, further comprising a sense amplifier electrically connected to the memory cell and the reference cell and configured to compare a current through the memory cell with a current through the reference cell to determine the data of the memory cell.

3. The device of claim 2, wherein the sense amplifier is located between the first cell array and the third cell array.

4. The device of claim 2, further comprising:
   bit lines connected to the memory cells and the reference cells in each of the first to fourth cell arrays;
   a first column decoder connected between the sense amplifier and the bit lines in the first cell array;
   a second column decoder connected between the sense amplifier and the bit lines in the second cell array;

a third column decoder connected between the sense amplifier and the bit lines in the third cell array; and a fourth column decoder connected between the sense amplifier and the bit lines in the fourth cell array.

5. The device of claim 4, wherein an unselected bit line of the bit lines is set to a ground voltage.

6. The device of claim 2, further comprising:
source lines connected to the memory cells and the reference cells in each of the first to fourth cell arrays;
a first current sink receiving the current and connected to the source lines in the first and second cell arrays; and
a second current sink receiving the current and connected to the source lines in the third and fourth cell arrays.

7. The device of claim 6, wherein the first and second current sink are located to sandwich the first to fourth cell arrays in the second direction.

8. The device of claim 6, wherein an unselected source line of the source lines is set to a ground voltage.

9. The device of claim 6, wherein the variable resistance element is a magnetoresistive element.

10. The device of claim 1, further comprising:
a first row decoder connected to the first cell array;
a second row decoder connected to the second cell array;
a third row decoder connected to the third cell array; and
a fourth row decoder connected to the fourth cell array.

11. The device of claim 10, wherein
the first and second row decoders are located between the first cell array and the second cell array, and
the third and fourth row decoders are located between the third cell array and the fourth cell array.

12. The device of claim 10, wherein the variable resistance element is a magnetoresistive element.

13. The device of claim 1, further comprising:
a global row decoder connected to the first to fourth word lines, the first reference word line, and the second reference word line; and
a global column decoder connected to the first to fourth select lines.

14. The device of claim 1, wherein
the memory cell comprises a select transistor connected to the variable resistance element, and
the reference cell comprises a resistance element and a select transistor connected to the resistance element.

15. The device of claim 1, wherein the variable resistance element is a magnetoresistive element.

16. The device of claim 15, wherein the magnetoresistive element comprises a reference layer with an invariable magnetization direction, a recording layer with a variable magnetization direction, and a nonmagnetic layer sandwiched between the reference layer and the recording layer.

17. A method of reading a semiconductor memory device, the semiconductor memory device comprising:
a first cell array comprising first memory cells and first reference cells, each of the first memory cells comprising a variable resistance element;
a second cell array located adjacent to the first cell array in a first direction, the second cell array comprising second memory cells and second reference cells, each of the second memory cells comprising a variable resistance element;
a third cell array located adjacent to the first cell array in a second direction crossing the first direction, the third cell array comprising third memory cells and third reference cells, each of the third memory cells comprising a variable resistance element;
a fourth cell array located adjacent to the third cell array in the first direction, the fourth cell array comprising fourth memory cells and fourth reference cells, each of the fourth memory cells comprising a variable resistance element;
a first word line electrically connected to a part of the first memory cells and the second memory cells;
a second word line electrically connected to the other part of the first memory cells and the second memory cells;
a first reference word line electrically connected to the first reference cells and the second reference cells;
a third word line electrically connected to a part of the third memory cells and the fourth memory cells;
a fourth word line electrically connected to the other part of the third memory cells and the fourth memory cells;
a second reference word line electrically connected to the third reference cells and the fourth reference cells;
a first select line electrically connected to a part of the first memory cells and the third memory cells;
a second select line electrically connected to the other part of the first memory cells and the third memory cells;
a third select line electrically connected to a part of the second memory cells and the fourth memory cells; and
a fourth select line electrically connected to the other part of the second memory cells and the fourth memory cells,
the method comprising:
simultaneously selecting, in a first read, the first word line, the second reference word line, the first select line, and the third select line; and
simultaneously selecting, in a second read, the second word line, the second reference word line, the first select line or second select line, and the third select line or fourth select line after the first read.

* * * * *